(12) United States Patent
Machida et al.

(10) Patent No.: US 9,873,137 B2
(45) Date of Patent: Jan. 23, 2018

(54) ULTRASONIC TRANSDUCER, METHOD OF PRODUCING SAME, AND ULTRASONIC PROBE USING SAME

(71) Applicant: HITACHI, LTD., Tokyo (JP)

(72) Inventors: Shuntaro Machida, Kokubunji (JP); Takashi Kobayashi, Higashimurayama (JP)

(73) Assignee: HITACHI, LTD., Tokyo (JP)

( * ) Notice: Subject to any disclaimer, the term of this patent is extended or adjusted under 35 U.S.C. 154(b) by 377 days.

(21) Appl. No.: 14/799,632

(22) Filed: Jul. 15, 2015

(65) Prior Publication Data

US 2016/0008849 A1    Jan. 14, 2016

Related U.S. Application Data

(62) Division of application No. 13/201,114, filed as application No. PCT/JP2010/001200 on Feb. 23, 2010, now abandoned.

(30) Foreign Application Priority Data

Mar. 5, 2009   (JP) .................................. 2009-052125

(51) Int. Cl.
*B06B 1/02*      (2006.01)
*B81C 1/00*      (2006.01)
*C09K 13/00*     (2006.01)
*H01L 21/306*    (2006.01)
*C23F 4/00*      (2006.01)
*H01L 29/84*     (2006.01)

(52) U.S. Cl.
CPC ........ *B06B 1/0292* (2013.01); *B81C 1/00182* (2013.01); *B81C 1/00476* (2013.01);
(Continued)

(58) Field of Classification Search
CPC ............... B06B 1/0292; B81C 1/00611; B81C 1/00476; B81C 1/00182; B81C 1/00214;
(Continued)

(56) References Cited

U.S. PATENT DOCUMENTS 6,320,239 B1   11/2001   Eccardt
6,430,109 B1   8/2002    Khuri
(Continued)

FOREIGN PATENT DOCUMENTS

JP   2006211185 A   8/2006
JP   2007097760 A   4/2007
(Continued)

*Primary Examiner* — Anita K Alanko
(74) *Attorney, Agent, or Firm* — Brundidge & Stanger, P.C.

(57) ABSTRACT

Disclosed is an ultrasonic transducer that is provided with: a bottom electrode; an electric connection part which is connected to the bottom electrode from the bottom of the bottom electrode; a first insulating film which is formed so as to cover the bottom electrode; a cavity which is formed on the first insulating film so as to overlap the bottom electrode when seen from above; a second insulating film which is formed so as to cover the cavity; and a top electrode which is formed on the second insulating film so as to overlap the cavity when seen from above. The electric connection part to the bottom electrode is positioned so as to not overlap the cavity when seen from above.

3 Claims, 25 Drawing Sheets

(52) U.S. Cl.
CPC ...... *B81C 1/00611* (2013.01); *B81C 1/00158* (2013.01); *B81C 1/00214* (2013.01); *B81C 1/00531* (2013.01); *B81C 2201/0104* (2013.01); *B81C 2201/0107* (2013.01); *B81C 2201/0109* (2013.01); *C09K 13/00* (2013.01); *C23F 4/00* (2013.01); *H01L 21/30604* (2013.01); *H01L 29/84* (2013.01); *Y10T 29/49156* (2015.01)

(58) Field of Classification Search
CPC ............ B81C 1/00158; B81C 1/00531; B81C 2201/0107; B81C 2201/0109; B81C 2201/0104; C09K 13/00; H01L 21/30604; H01L 29/84; C23F 4/00; Y10T 29/49156
See application file for complete search history.

(56) References Cited

U.S. PATENT DOCUMENTS

| | | | |
|---|---|---|---|
| 6,562,650 | B2 | 5/2003 | Ladabaum |
| 6,571,445 | B2 | 6/2003 | Ladabaum |
| 2006/0179640 | A1* | 8/2006 | Machida ................ B06B 1/0292 29/594 |
| 2007/0052093 | A1* | 3/2007 | Machida ................ B06B 1/0292 257/735 |
| 2008/0001239 | A1* | 1/2008 | Enomoto ............ G01S 7/52079 257/416 |
| 2008/0067895 | A1 | 3/2008 | Adachi |
| 2008/0089180 | A1 | 4/2008 | Matsumoto |
| 2008/0269614 | A1 | 10/2008 | Adachi |
| 2008/0274576 | A1* | 11/2008 | Enomoto ............ G01S 15/8925 438/51 |
| 2009/0001853 | A1 | 1/2009 | Adachi |
| 2009/0058228 | A1 | 3/2009 | Wakabayashi |
| 2009/0076393 | A1 | 3/2009 | Adachi |
| 2010/0179430 | A1 | 7/2010 | Sano |
| 2011/0316383 | A1 | 12/2011 | Machida |

FOREIGN PATENT DOCUMENTS

| | | |
|---|---|---|
| JP | 2007229327 A | 9/2007 |
| JP | 2008099036 | 4/2008 |

* cited by examiner 312  304    305        308
     310  1901  306   2001

ULTRASONIC TRANSDUCER, METHOD OF PRODUCING SAME, AND ULTRASONIC PROBE USING SAME

CROSS-REFERENCED TO RELATED APPLICATIONS

The present application is a Divisional Application of application Ser. No. 13/201,114, filed Aug. 11, 2011, which claims priority from PCT/JP2010/001200, filed Feb. 23, 2010; and Japanese Application No. 2009/052125, filed Mar. 5, 2009, the entire disclosure of which is incorporated herein by reference.

TECHNICAL FIELD

The present invention relates to an ultrasonic transducer, a method of producing the same, and an ultrasonic probe using the same. Particularly, the present invention relates to an ultrasonic transducer produced by an MEMS (Micro Electro Mechanical System) technique and the most suitable method of producing the same.

BACKGROUND ART

An ultrasonic transducer that transmits and receives ultrasonic waves is used in a diagnosis for a tumor and the like in a human body or in a nondestructive inspection and the like for a structure.

There has been used so far an ultrasonic transducer using oscillation of a piezoelectric body. However, with the development of the recent MEMS technology, a CMUT (Capacitive Micromachined Ultrasonic Transducer) in which an oscillation unit is formed on a silicon substrate has been actively developed in an effort to realize practical use.

U.S. Pat. No. 6,320,239B1 (Patent Literature 1) discloses a single CMUT and those arranged in array.

Each of U.S. Pat. No. 6,571,445B2 (Patent Literature 2) and U.S. Pat. No. 6,562,650B2 (Patent Literature 3) discloses a technique of forming a CMUT on a signal processing circuit formed on a silicon substrate.

U.S. Pat. No. 6,430,109B1 (Patent Literature 4) discloses a technique of supplying an electric signal to a bottom electrode of a CMUT formed on a silicon substrate by providing a hole penetrating the silicon substrate.

CITATION LIST

Patent Literature

Patent Literature 1: U.S. Pat. No. 6,320,239B1
Patent Literature 2: U.S. Pat. No. 6,571,445B2
Patent Literature 3: U.S. Pat. No. 6,562,650B2
Patent Literature 4: U.S. Pat. No. 6,430,109B1

SUMMARY OF INVENTION

Technical Problem

A CMUT is advantageous in its wide range of the available frequency band of ultrasonic waves and its high sensitivity, as compared to a conventional transducer using a piezoelectric body. Further, microfabrication is available because the CMUT is produced using an LSI processing technique. Especially, it is conceivable that the CMUT is essential when ultrasonic elements are arranged in array and each element is independently controlled. Because, although it is conceivable that wirings to the respective elements are necessary and the number of wirings in the arrays becomes enormous, these wirings can be easily formed because the CMUT is produced by using the LSI processing technique. Further, the CMUT enables consolidation of a signal processing circuit to one chip from an ultrasonic transmission/reception unit.

A basic structure and operation of a CMUT will be described using FIG. 22. FIG. 22 shows a cross-sectional structure of one CMUT cell. A cavity 102 is formed on a bottom electrode 101, and an insulating film 103 encloses the cavity 102. A top electrode 104 is arranged on the insulating film 103. The insulating film 103 and the top electrode 104 serve as a membrane 105 that oscillates at the time of driving the CMUT.

When DC voltage and AC voltage are superimposed between the top electrode 104 and the bottom electrode 101, electrostatic force is generated between the top electrode 104 and the bottom electrode 101, and the membrane 105 oscillates at the frequency of the applied AC voltage to transmit ultrasonic waves.

On the contrary, in the case of reception, the membrane 105 oscillates due to the pressure of ultrasonic waves reaching a surface of the membrane 105. Then, the distance between the top electrode 104 and the bottom electrode 101 is changed, and thus the ultrasonic waves can be detected as a change in capacitance.

As being apparent from the above-described operating principle, the ultrasonic waves are transmitted and received using the electrostatic force and electrostatic capacitance between the top electrode 104 and the bottom electrode 101, and thus the distance including the cavity 102 between the top electrode 104 and the bottom electrode 101 has a major effect on ultrasonic transmission and reception characteristics. Specifically, in the case where the CMUT is designed and produced to obtain a desired transmission acoustic pressure and reception sensitivity, it is necessary to control the thicknesses of the cavity 102 and the insulating film 103 sandwiched between the top and bottom electrodes, irregularities of the surface of the bottom electrode, and swellings and dents of the membrane. Especially, in the case where plural CMUT cells is arranged in array, variations in the respective cells cause variations in ultrasonic characteristics, and the designed, desired transmission acoustic pressure and reception sensitivity cannot be obtained.

FIGS. 23A-C are top views each showing the positions of the bottom electrodes and the top electrodes in the case of arranging the CMUTs in array. FIG. 23A shows a strip-shaped arrangement of the CMUT arrays. The top electrodes are shared on a strip basis and the bottom electrode is shared by the all strips. This type of CMUT is called a one-dimensional CMUT. In the one-dimensional CMUT, phases in transmission and reception are changed in a direction (called an azimuth direction) of strip arrangements, so that ultrasonic waves can be converged only in the azimuth direction. FIG. 23B shows an arrangement in which the bottom electrode of the one-dimensional CMUT of FIG. 23A is divided and the top electrodes are orthogonal to the bottom electrodes. In this arrangement, ultrasonic waves can be converged not only in the azimuth direction, but also in a direction (called an elevation direction) orthogonal to the azimuth direction. This type of CMUT is called a 1.5-dimensional CMUT. Because ultrasonic waves can be converged not only in the azimuth direction, but also in the elevation direction, an ultrasonic image with higher resolution can be obtained as compared to that obtained by the one-dimensional CMUT. FIG. 23C shows an arrangement for independently controlling respective intersection points in the azimuth direction and the elevation direction of the 1.5-dimensional CMUT, and this type of CMUT is called a two-dimensional CMUT. The bottom electrodes are not shown because the bottom electrodes overlap the top electrodes. In the two-dimensional CMUT, ultrasonic waves can be converged in an arbitrary direction, and a three-dimensional image can be obtained at a high speed.

As being apparent from the arrangements illustrated in FIGS. 23A and 23B, electric power can be supplied to the bottom electrodes and the top electrodes from end portions of the respective arrays in the one-dimensional and 1.5-dimensional CMUTs. However, electric power needs to be supplied from an upper surface or a lower surface of each array because each array needs to be independently connected in the two-dimensional CMUT of FIG. 23C.

Patent Literature 1 discloses a CMUT in which a silicon substrate is used for a bottom electrode, and corresponds to the one-dimensional CMUT of FIG. 23A. The bottom electrode is shared by the whole arrays, and thus electric connection to the bottom electrode and the top electrodes can be established at end portions that do not overlap the arrays.

Each of the CMUTs disclosed in Patent Literatures 2 and 3 is formed on the signal processing circuit formed on the silicon substrate, and electric connection to the bottom electrode is established from a lower surface of the bottom electrode. Even in the CMUT disclosed in Patent Literature 4, electric connection is established from a lower surface of the bottom electrode through a hole penetrating the silicon substrate. The CMUTs disclosed in Patent Literatures 2, 3 and 4 are assumed as the two-dimensional CMUTs, and electric connection parts to the top electrodes are positioned so as not to overlap the cavities when seen from above. Electric connection parts to the bottom electrodes are positioned so as to overlap the cavities when seen from above.

FIG. 24 shows a cross-sectional view of a CMUT in which an electric connection part to a bottom electrode overlaps a cavity when seen from above. The reference numeral 106 denotes an electric connection part to a bottom electrode; 107, a wiring arranged at a lower layer of a CMUT cell; and 108, an insulating film. As shown in FIG. 24, a dent is generated in an electric connection part forming step, possibly causing deformation in the cavity, non-uniformity in the thickness of the insulating film enclosing the cavity, and non-flatness of the surface profile of the membrane. In the case where the CMUT cells are arranged in array, these factors cause variations in ultrasonic transmission and reception characteristics of the respective cells, and thus the designed, desired transmission acoustic pressure and reception sensitivity cannot be obtained.

An object of the present invention is to provide a structure of a CMUT and a method of producing the same in which variations in characteristics of respective cells are suppressed when electric connection to a bottom electrode is established.

The above and other objects, and novel characteristics of the present invention will become apparent from the description of the specification and the accompanying drawings.

Solution to Problem

The followings are summaries of the representative aspects of the invention disclosed in the application.

An ultrasonic transducer according to an aspect of the present invention including: (a) a bottom electrode; (b) an electric connection part that is connected to the bottom electrode from a lower surface of the bottom electrode; (c) a first insulating film that is formed so as to cover the bottom electrode; (d) a cavity that is formed on the first insulating film so as to overlap the bottom electrode when seen from above; (e) a second insulating film that is formed so as to cover the cavity; and (f) a top electrode that is formed on the second insulating film so as to overlap the cavity when seen from above, the ultrasonic transducer wherein (g) the electric connection part is positioned where the electric connection part does not overlap the cavity when seen from above.

Further, an ultrasonic transducer according to another aspect of the present invention including: (a) plural bottom electrodes; (b) plural electric connection parts that is connected to the plural bottom electrodes from respective lower surfaces of the plural bottom electrodes; (c) a first insulating film that is formed so as to cover the plural bottom electrodes; (d) plural cavities that is formed on the first insulating film so as to overlap the plural bottom electrodes when seen from above; (e) a second insulating film that is formed so as to cover the plural cavities; and (f) plural top electrodes that is formed on the second insulating film so as to overlap the plural cavities when seen from above, the ultrasonic transducer wherein (g) the plural electric connection parts is positioned where the plural electric connection parts do not overlap the plural cavities when seen from above.

Further, the ultrasonic transducer according to another aspect of the present invention including: (h) a semiconductor substrate; (i) a wiring that is formed on the semiconductor substrate; and (j) a third insulating film that is formed so as to cover the wiring, the ultrasonic transducer wherein (k) the other end of the electric connection part is connected to the wiring through an opening of the third insulating film.

Further, the ultrasonic transducer according to another aspect of the present invention including: (l) a second electric connection part, the ultrasonic transducer wherein one end of the second electric connection part is connected to the top electrode through the opening of the third insulating film, and the other end of the second electric connection part is connected to the wiring formed on the semiconductor substrate.

An ultrasonic probe of the present invention using any one of the above-described ultrasonic transducers.

Further, a method of producing an ultrasonic transducer according to an aspect of the present invention, the method including the steps of: (a) forming a wiring; (b) forming a first insulating film that covers the wiring; (c) flattening the first insulating film; (d) forming, in the first insulating film, a first opening that reaches the wiring; (e) forming an electric connection part by embedding a conductive film into the first opening; (f) forming a bottom electrode on the electric connection part; (g) forming a second insulating film so as to cover the bottom electrode; (h) forming a sacrifice layer on the first insulating film at a position where the sacrifice layer overlaps the bottom electrode, but does not overlap the electric connection part when seen from above; (i) forming a third insulating film so as to cover the sacrifice layer; (j) forming a top electrode on the third insulating film so as to overlap the sacrifice layer when seen from above; (k) forming a fourth insulating film that covers the top electrode and the third insulating film; (l) forming a second opening that penetrates the third insulating film and the fourth insulating film to reach the sacrifice layer; (m) forming a cavity by removing the sacrifice layer using the second opening; and (n) sealing the cavity by forming a fifth insulating film so as to cover the opening that reaches the second insulating film and the sacrifice layer.

It should be noted that the present invention includes not only a case in which one cavity overlaps one bottom electrode in one CMUT cell, but also a case in which plural cavities overlaps one bottom electrode.

Advantageous Effects of Invention

The following is an effect obtained by the representative aspects of the invention disclosed in the application.

In an ultrasonic transducer according to the present invention, even in the case where a bottom electrode is electrically connected from a lower surface of the bottom electrode, a connection part is positioned so as not to overlap a cavity when seen from above. Thus, it is possible to suppress deformation in the cavity, non-uniformity in the thickness of an insulating film enclosing the cavity, and deterioration in the flatness of the surface profile of a membrane. Accordingly, variations in ultrasonic transmission and reception characteristics of respective cells can be suppressed, and thus a designed, desired transmission acoustic pressure and reception sensitivity can be obtained.

BRIEF DESCRIPTION OF DRAWINGS

FIGS. 15A and 15B are cross-sectional views each showing a producing method in the case where a bottom electrode is formed after an electric connection part to the bottom electrode is formed in the first embodiment, wherein FIG. 15A is a cross-sectional view taken along the line A-A' of FIG. 1, and FIG. 15B is a cross-sectional view taken along the line B-B' of FIG. 1.

FIG. 18A is a cross-sectional view of the ultrasonic transducer produced by the producing method in which the bottom electrode is formed after the electric connection part to the bottom electrode illustrated in each of FIGS. 15A and 15B to FIGS. 17A and 17B is formed, wherein FIG. 18A is a cross-sectional view taken along the line A-A' of FIG. 1.

DESCRIPTION OF EMBODIMENTS

The present invention will be described in plural sections or embodiments if necessary as a matter of convenience. However, the sections or embodiments are not completely unrelated to each other, and one section or embodiment has a relation to part or all of the others in terms of explanation of modified examples, detailed explanation, and supplemental explanation except as otherwise stated. Further, a reference to the number (including the number of pieces, values, amounts, ranges, and the like) of elements in the following embodiments is not limited to the specified number, but may be larger or smaller than the specified number except as otherwise stated and except a case that the reference is apparently limited to the specified number in principle. Moreover, it is obvious that constitutional elements (including elemental steps and the like) in the following embodiments are not necessarily essential except as otherwise stated and except a case that the constitutional elements are considered to be apparently essential in principle. Likewise, a reference to the shapes, positional relations, and the like of constitutional elements in the following embodiments virtually includes those closely related or similar to the shapes and the like except as otherwise stated and except a case that the reference is considered to be apparently different in principle. This also applies to the values and ranges. It should be noted that hatches are provided in some cases even in a plan view to facilitate understanding of the invention.

In the description of the following embodiments, an object of suppressing deformation in a cavity, deterioration in uniformity of an insulating film, and deterioration in flatness of the surface profile of a membrane even in the case where a bottom electrode of an ultrasonic transducer is electrically connected from a lower surface of the bottom electrode is realized by positioning an electric connection part to the bottom electrode so as not to overlap a cavity when seen from above.

First Embodiment

Figure 1:
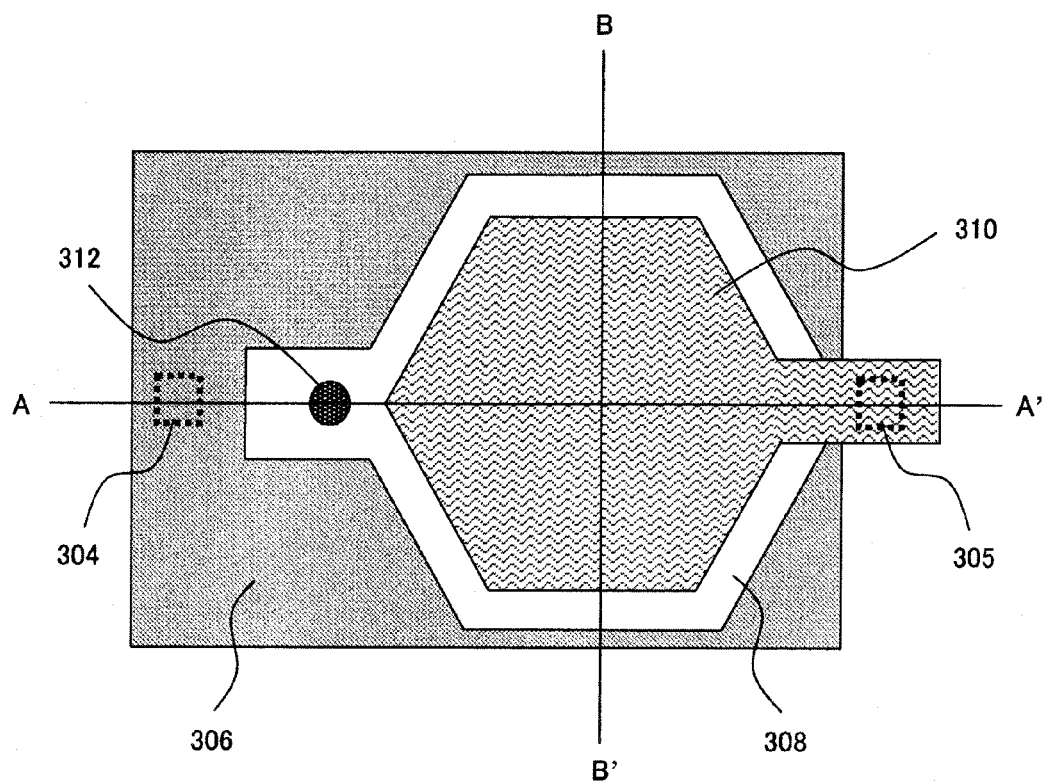
FIG. 1 is a top view for showing an ultrasonic transducer in a first embodiment of the present invention.

FIG. 1 is a top view of one CMUT cell. The reference numeral 306 denotes a bottom electrode; 308, a cavity; 310, a top electrode; and 312, an etching hole used for forming the cavity 308. Specifically, the etching hole 312 is connected to the cavity 308. The reference numeral 304 denotes a connection part that is electrically connected to the bottom electrode 306 from a lower layer, and 305 denotes a connection part that is electrically connected to the top electrode from a lower layer. An insulating film is formed between the top electrode 310 and the bottom electrode 306 so as to cover the cavity 308 and the bottom electrode 306, but is not shown in the drawing in order to illustrate the cavity 308 and the bottom electrode 306.

Figure 2A:
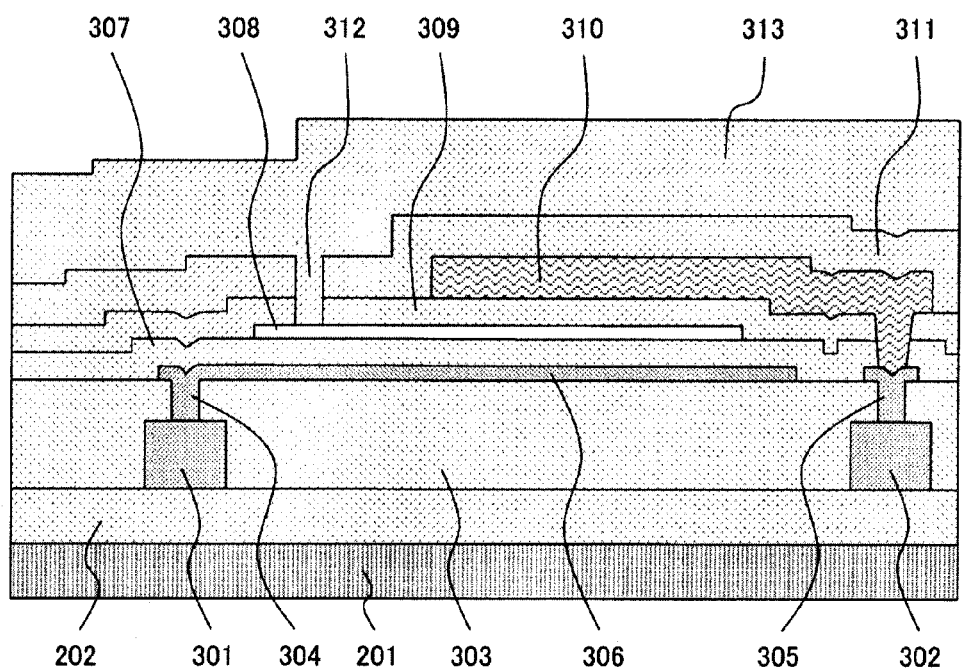
FIG. 2A is a cross-sectional view taken along the line A-A' of FIG. 1.
Figure 2B:
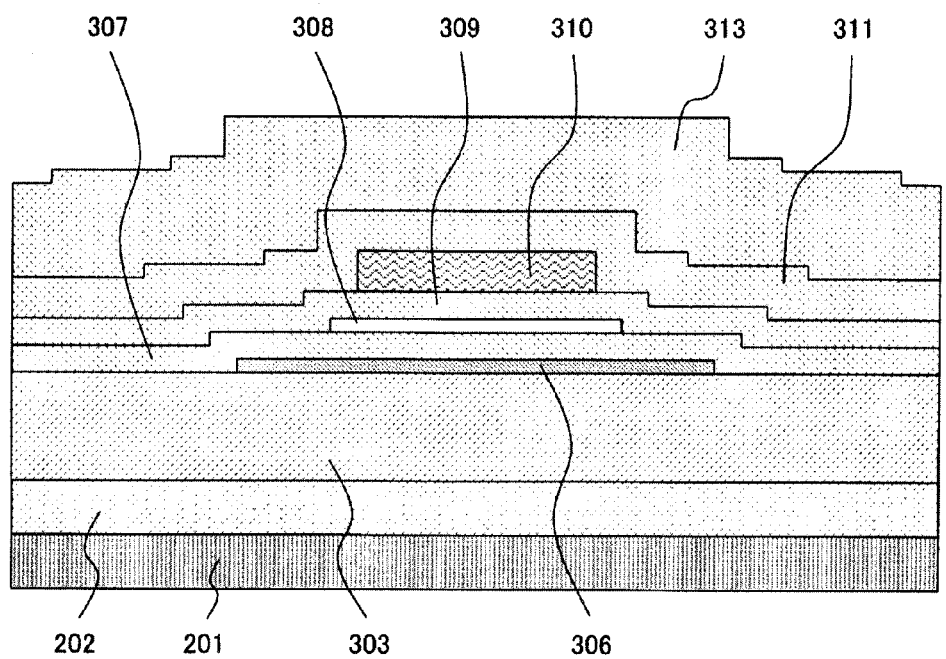
FIG. 2B is a cross-sectional view taken along the line B-B' of FIG. 1.

FIG. 2A shows a cross-section taken along the line A-A' of FIG. 1, and FIG. 2B shows a cross-section taken along the line B-B' of FIG. 1. As shown in FIG. 2A and FIG. 2B, wirings 301 and 302 are formed on an upper surface of an insulating film 202 on a semiconductor substrate 201, and an insulating film 303 is formed so as to cover the wirings. In the insulating film 303, the connection parts 304 and 305 that are electrically connected to the bottom electrode and the top electrode of the CMUT are formed on the wirings 301 and 302, respectively, and are connected to the bottom electrode 306 and the top electrode 310, respectively.

Above the bottom electrode 306, the cavity 308 is formed through an insulating film 307. An insulating film 309 is formed so as to enclose the cavity 308, and the top electrode 310 is formed on the insulating film 309. An insulating film 311 and an insulating film 313 are formed above the top electrode 310. In addition, the etching hole 312 penetrating the insulating film 309 and the insulating film 311 is formed therein. The etching hole 312 is formed to form the cavity 308, and the insulating film 313 is embedded into the etching hole 312 after forming the cavity 308. A membrane that oscillates at the time of driving the CMUT is formed of the insulating films 309, 311, 313, and the top electrode 310.

The first embodiment is characterized in that the connection part 304 to the bottom electrode 306 is positioned so as not to overlap the cavity 308 when seen from above as shown in FIG. 1 and FIGS. 2A and 2B. Even in the case where each electrode is electrically connected from the lower surface thereof, the cavity 308 can be formed without affects of the shape at the electric connection part 30 in such an arrangement. Likewise, the membrane located above the cavity 308 is not affected. Thus, it is possible to suppress deformation in the cavity and non-uniformity in the thickness of the insulating film enclosing the cavity. In addition, it is possible to suppress deterioration in the flatness of the surface profile of the membrane. Specifically, in the case where the electric connection part 304 to the bottom electrode 306 is positioned so as to overlap the cavity 308 when seen from above, a dent formed at an upper portion of the connection part 304 shown in FIG. 2A is reflected on the shapes of the cavity 308 and the membrane, causing deformation in the cavity and non-uniformity in the thickness of the insulating film enclosing the cavity. Further, the surface profile of the membrane becomes not flat. In the case where such CMUT cells are arranged in array, these factors cause variations in ultrasonic transmission and reception characteristics of the respective cells, and thus a designed, desired transmission sound pressure and reception sensitivity cannot be obtained. However, the electric connection part 304 to the bottom electrode 306 is positioned so as not to overlap the cavity 308 when seen from above in the first embodiment. Thus, even in the case where the bottom electrode is electrically connected from the lower surface of the bottom electrode, the cavity 308 and the membrane can be formed without affects of the shape at the electric connection part 304, and variations in ultrasonic characteristics of the respective cells can be suppressed.

Next, a method of producing the CMUT described in the first embodiment will be explained using the drawings. "A" in each of FIG. 3 to FIG. 14 shows a cross-sectional direction taken along the line A-A' of FIG. 1, and "B" in each of FIG. 3 to FIG. 14 shows a cross-sectional direction taken along the line B-B' of FIG. 1.

Figure 3A:
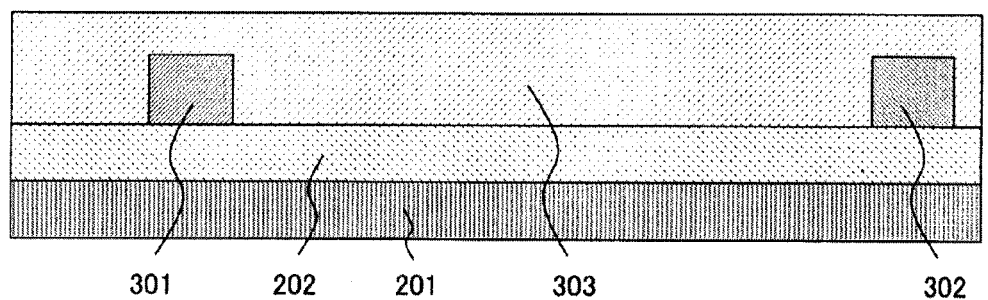
FIG. 3A shows a process of producing the ultrasonic transducer and a cross-sectional view taken along the line A-A' of FIG. 1.
Figure 3B:
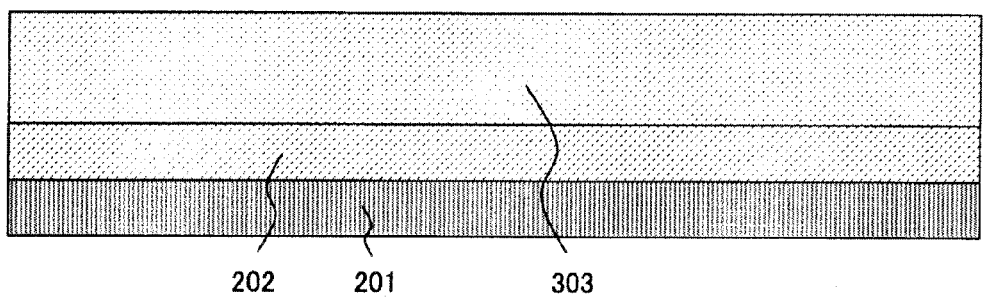
FIG. 3B shows a process of producing the ultrasonic transducer and a cross-sectional view taken along the line B-B' of FIG. 1.

First, as shown in FIGS. 3A and 3B, 400 nm of the silicon dioxide insulating film 202 is formed on the semiconductor substrate 201 by a plasma CVD (Chemical Vapor Deposition) method. The wirings 301 and 302, each of which is formed by depositing 50 nm of titanium nitride, 600 nm of aluminum alloy, and 50 nm of titanium nitride are formed on the insulating film 202. Thereafter, 500 nm of the silicon dioxide insulating film 303 is formed to cover the wirings 301 and 302 by the plasma CVD method. The insulating film 303 is flattened by a CMP (Chemical Mechanical Polishing) method.

Figure 4A:
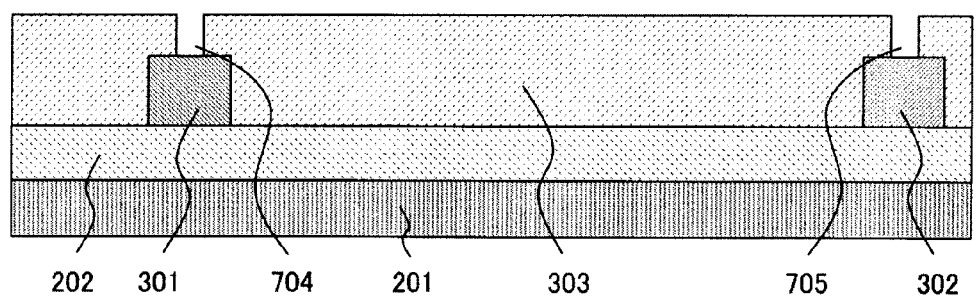
FIG. 4A is a cross-sectional view for showing a process of producing the ultrasonic transducer subsequent to FIG. 3A.
Figure 4B:
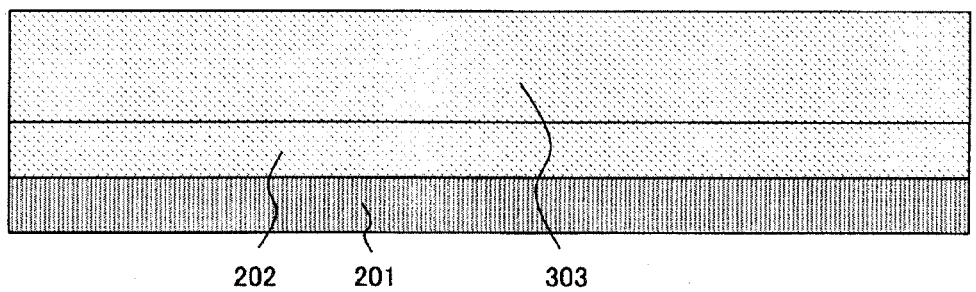
FIG. 4B is a cross-sectional view for showing a process of producing the ultrasonic transducer subsequent to FIG. 3B.

Next, openings 704 and 705 reaching the wirings 301 and 302, respectively, are formed in the insulating film 303 by a lithography technique and a dry etching technique (FIGS. 4A and 4B).

Figure 5A:
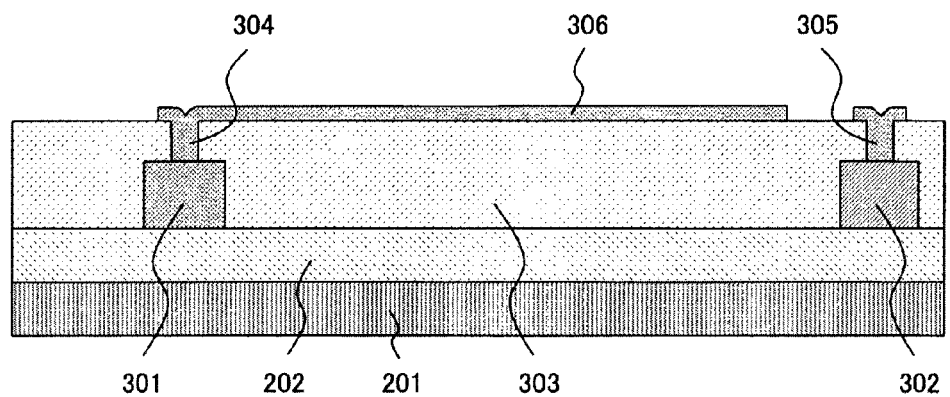
FIG. 5A is a cross-sectional view for showing a process of producing the ultrasonic transducer subsequent to FIG. 4A.
Figure 5B:
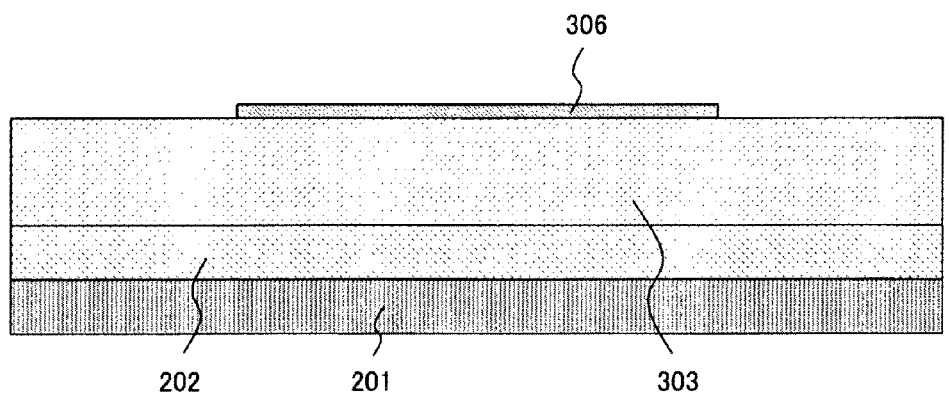
FIG. 5B is a cross-sectional view for showing a process of producing the ultrasonic transducer subsequent to FIG. 4B.

Subsequently, 100 nm of a conductive film serving as the bottom electrode of the CMUT is formed by a sputtering method. At this time, the openings 704 and 705 are also embedded with the conductive film. The bottom electrode 306, the electric connection part 304 to the bottom electrode, and the electric connection part 305 to the top electrode are formed by the lithography technique and the dry etching technique (FIGS. 5A and 5B). The conductive film serving as the bottom electrode 306 may be made of conductive material such as tungsten (W), titanium (Ti), aluminum (Al), copper (Cu), alloy thereof, nitride, or silicon compound used in a general semiconductor process. Since the bottom electrode is connected through the wiring 301 near the CMUT cell, a decrease in resistance can be suppressed to the minimum, and thus the thickness of the conductive film may be about 100 nm.

Figure 6A:
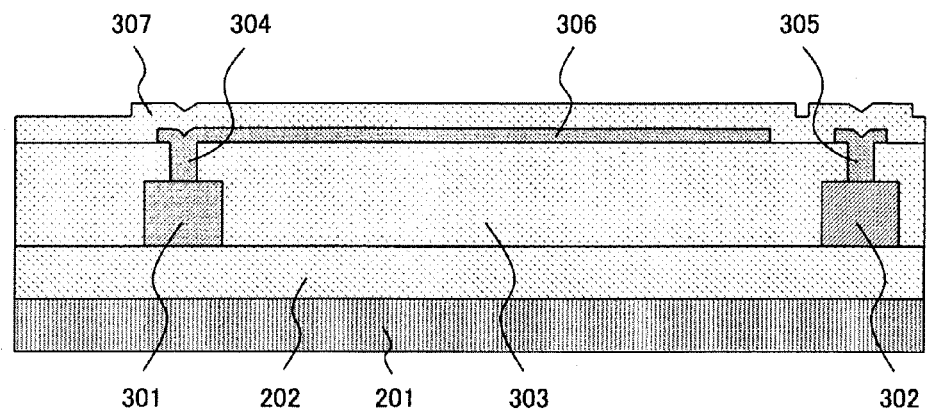
FIG. 6A is a cross-sectional view for showing a process of producing the ultrasonic transducer subsequent to FIG. 5A.
Figure 6B:
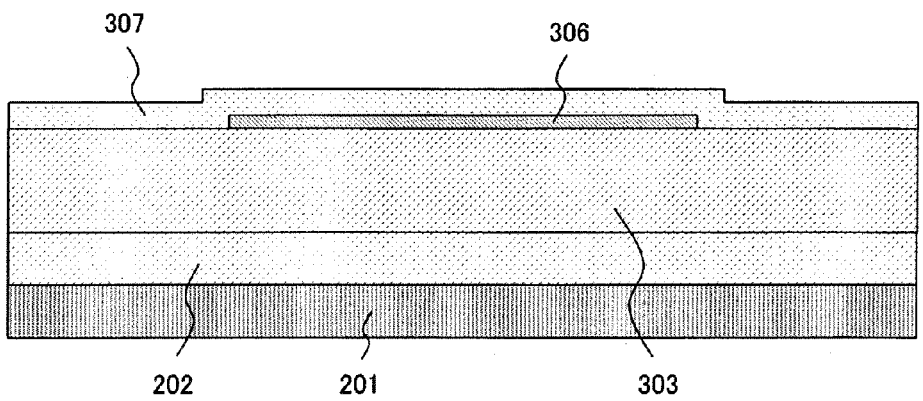
FIG. 6B is a cross-sectional view for showing a process of producing the ultrasonic transducer subsequent to FIG. 5B.

Then, 200 nm of the silicon dioxide insulating film 307 is deposited on the bottom electrode 306 by the plasma CVD method (FIGS. 6A and 6B).

Figure 7A:
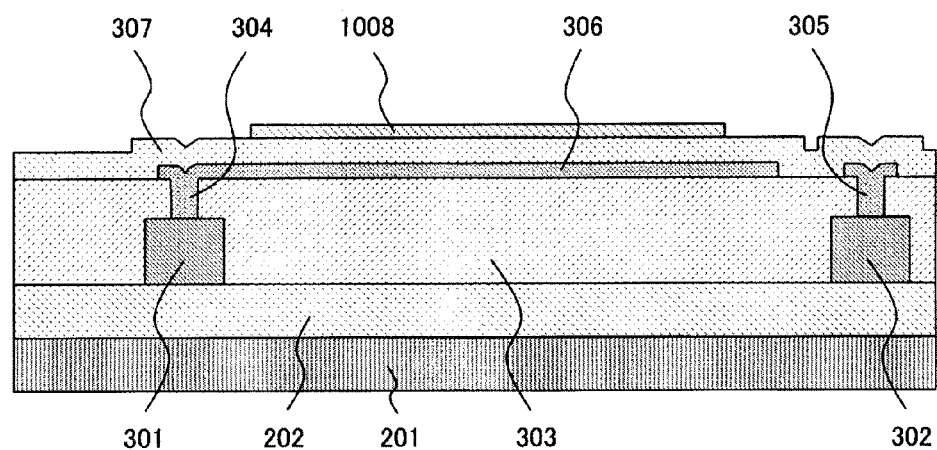
FIG. 7A is a cross-sectional view for showing a process of producing the ultrasonic transducer subsequent to FIG. 6A.
Figure 7B:
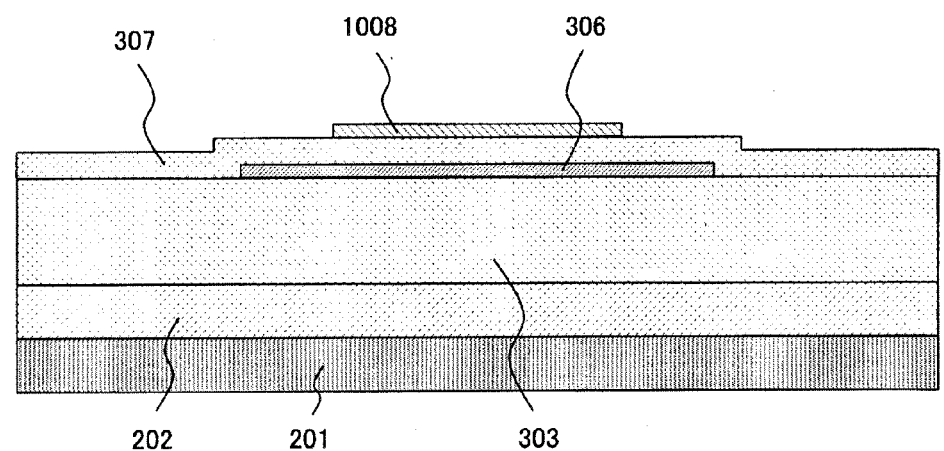
FIG. 7B is a cross-sectional view for showing a process of producing the ultrasonic transducer subsequent to FIG. 6B.

Next, 100 nm of an amorphous silicon film is deposited on the silicon dioxide insulating film 307 by the plasma CVD method. Thereafter, the amorphous silicon film is processed by the lithography technique and the dry etching technique to form a sacrifice layer 1008 (FIGS. 7A and 7B). At this time, the pattern of the sacrifice layer is positioned so as not to overlap the connection part 304 to the bottom electrode when seen from above. The sacrifice layer serves as the cavity in the following steps.

Figure 8A:
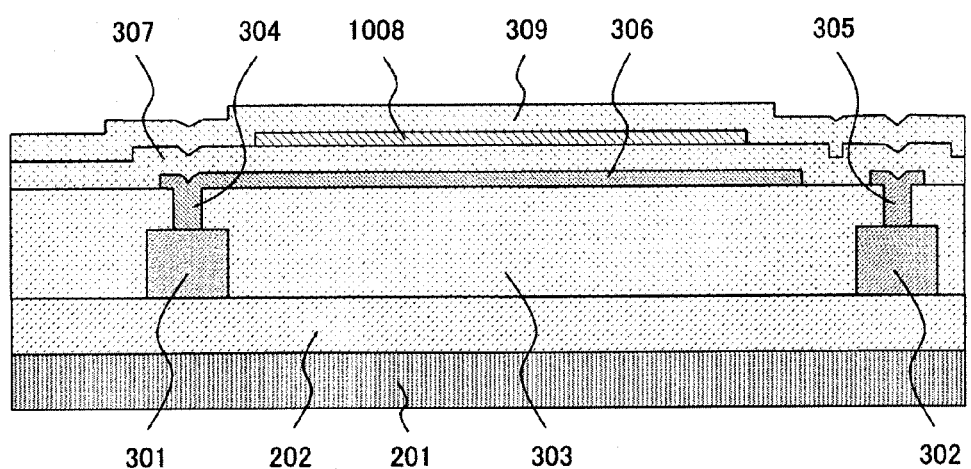
FIG. 8A is a cross-sectional view for showing a process of producing the ultrasonic transducer subsequent to FIG. 7A.
Figure 8B:
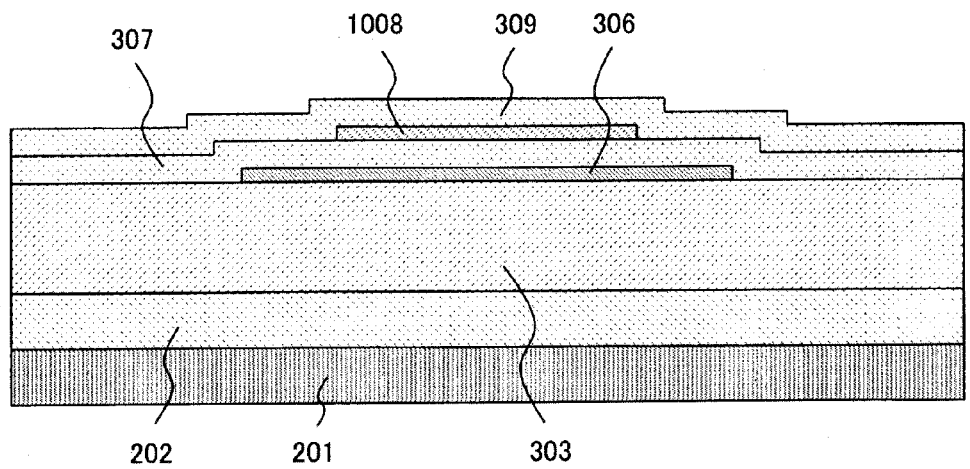
FIG. 8B is a cross-sectional view for showing a process of producing the ultrasonic transducer subsequent to FIG. 7B.

Next, 200 nm of the silicon dioxide insulating film 309 is deposited so as to cover the sacrifice layer 1008 and the silicon dioxide insulating film 307 by the plasma CVD method (FIGS. 8A and 8B).

Figure 9A:
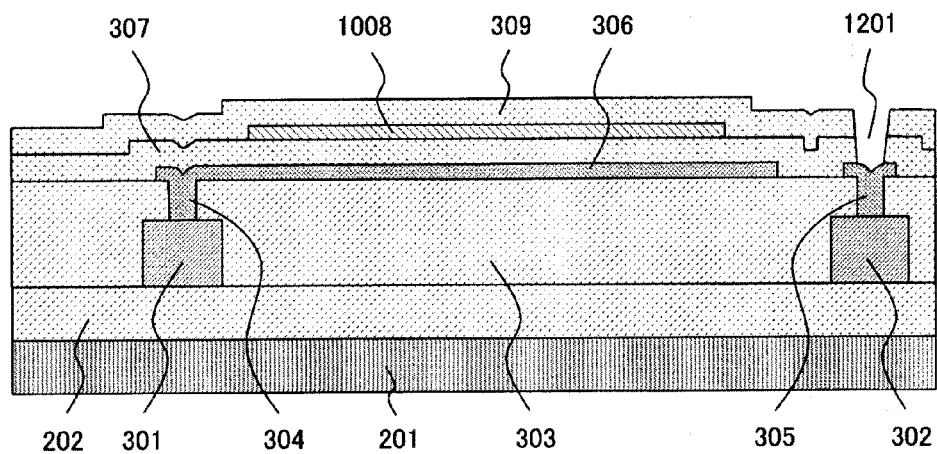
FIG. 9A is a cross-sectional view for showing a process of producing the ultrasonic transducer subsequent to FIG. 8A.
Figure 9B:
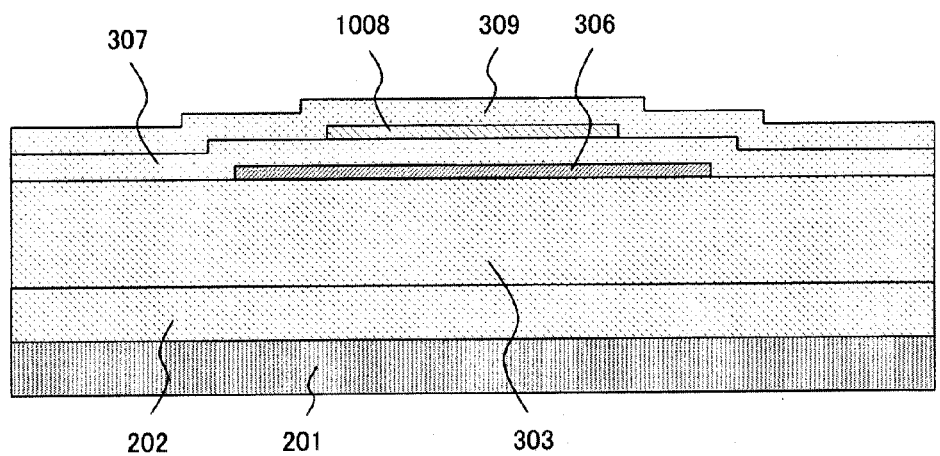
FIG. 9B is a cross-sectional view for showing a process of producing the ultrasonic transducer subsequent to FIG. 8B.

Next, an opening 1201 reaching the electric connection part 305 for the top electrode is formed in the insulating films 307 and 309 by the lithography technique and the dry etching technique (FIGS. 9A and 9B).

Figure 10A:
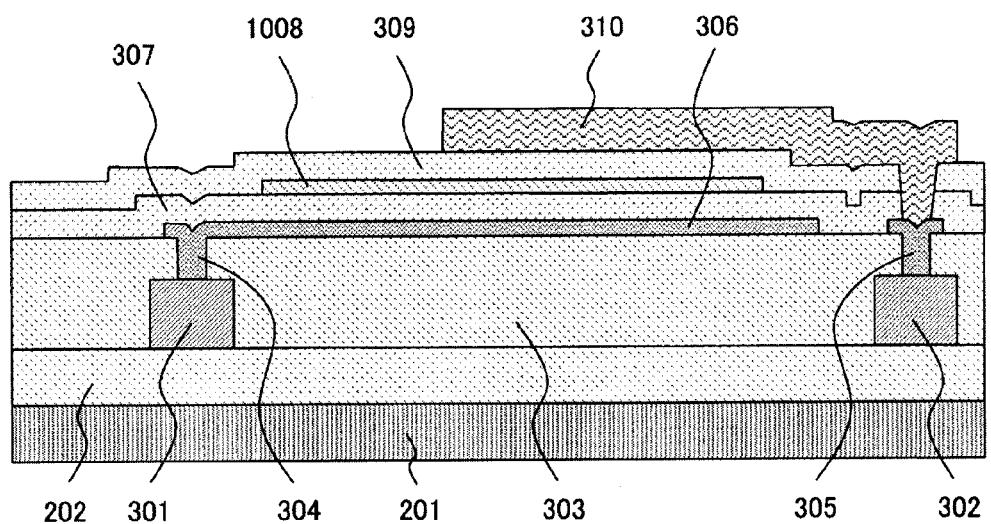
FIG. 10A is a cross-sectional view for showing a process of producing the ultrasonic transducer subsequent to FIG. 9A.
Figure 10B:
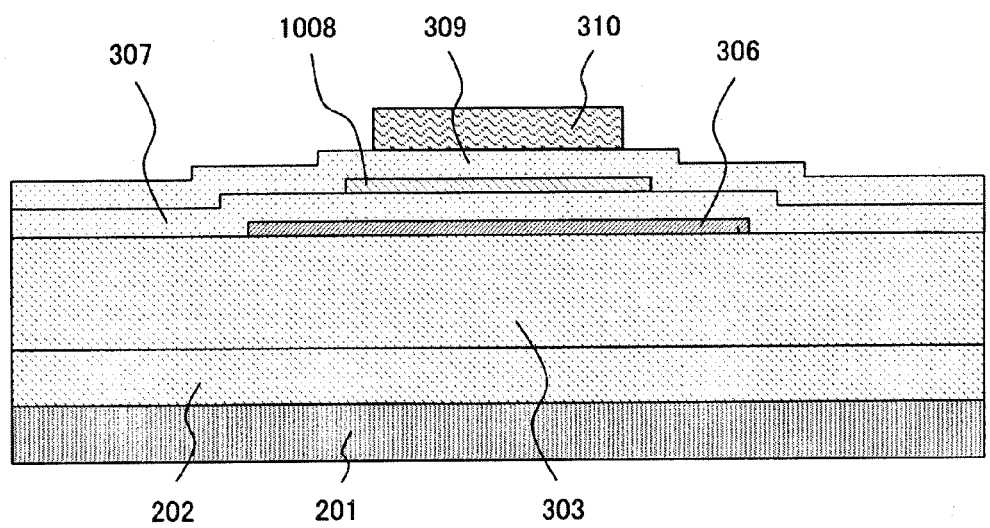
FIG. 10B is a cross-sectional view for showing a process of producing the ultrasonic transducer subsequent to FIG. 9B.

Next, in order to form the top electrode 310 of the CMUT, laminated films of 50 nm of a titanium nitride film, 300 nm of an aluminum alloy film, and 50 nm of a titanium nitride film are deposited by the sputtering method. Then, the top electrode 310 is formed by the lithography technique and the dry etching technique. At this time, the opening 1201 formed in the insulating films 307 and 309 is simultaneously embedded with the top electrode, and the top electrode 310 and the wiring 302 are connected to each other through the electric connection part 305 (FIGS. 10A and 10B).

Figure 11A:
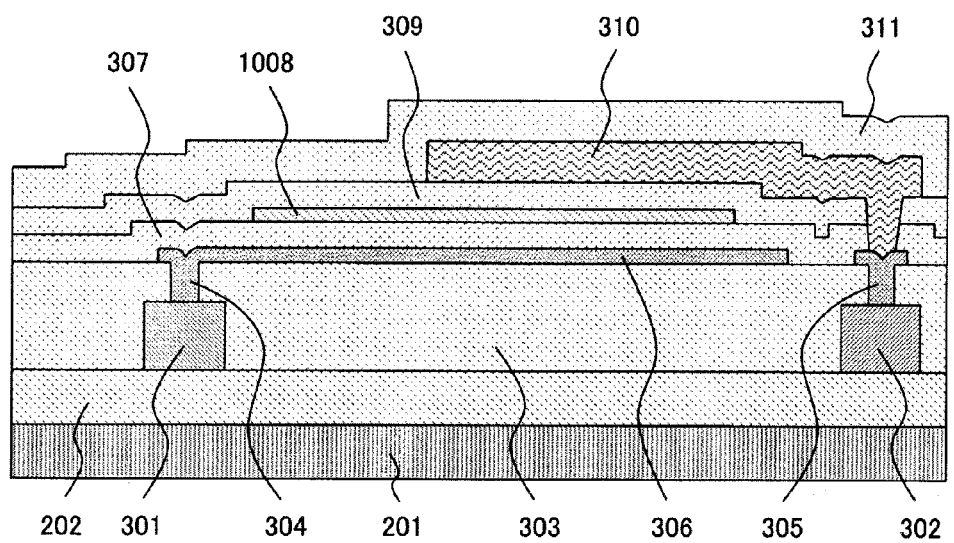
FIG. 11A is a cross-sectional view for showing a process of producing the ultrasonic transducer subsequent to FIG. 10A.
Figure 11B:
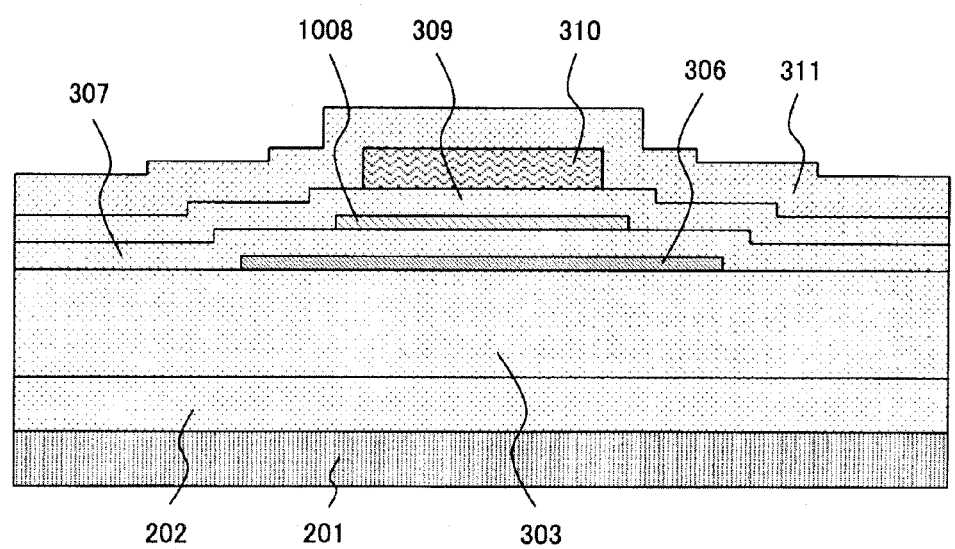
FIG. 11B is a cross-sectional view for showing a process of producing the ultrasonic transducer subsequent to FIG. 10B.

Next, 300 nm of the silicon nitride insulating film 311 is deposited so as to cover the silicon dioxide film 309 and the top electrode 310 by the plasma CVD method (FIGS. 11A and 11B).

Figure 12A:
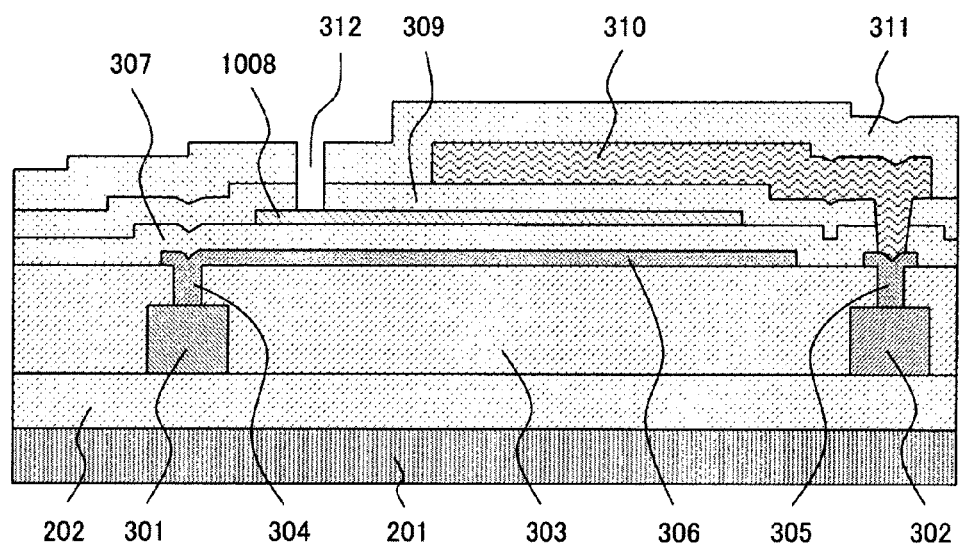
FIG. 12A is a cross-sectional view for showing a process of producing the ultrasonic transducer subsequent to FIG. 11A.
Figure 12B:
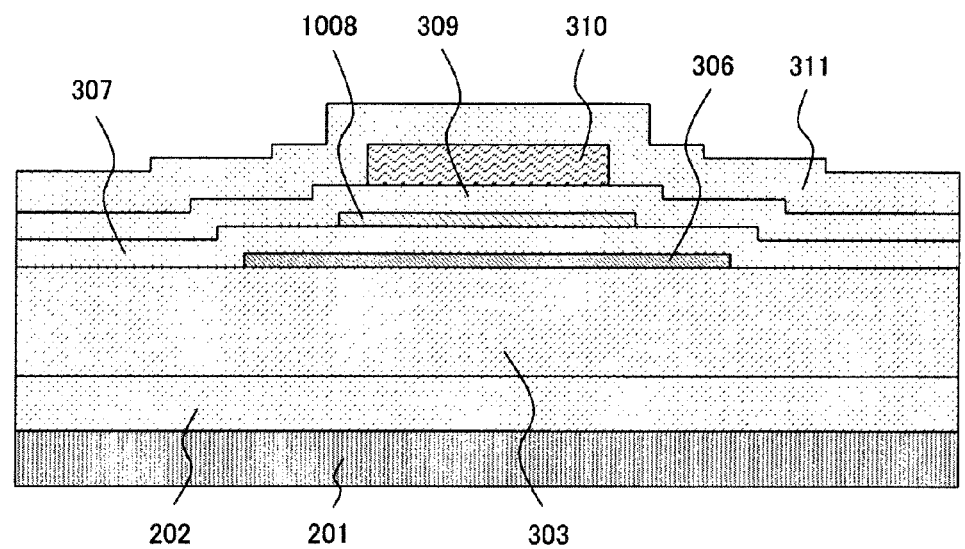
FIG. 12B is a cross-sectional view for showing a process of producing the ultrasonic transducer subsequent to FIG. 11B.

Subsequently, an etching hole 312 reaching the sacrifice layer 1008 is formed in the silicon nitride insulating film 311 and the silicon dioxide insulating film 309 by the lithography technique and the dry etching technique (FIGS. 12A and 12B).

Figure 13A:
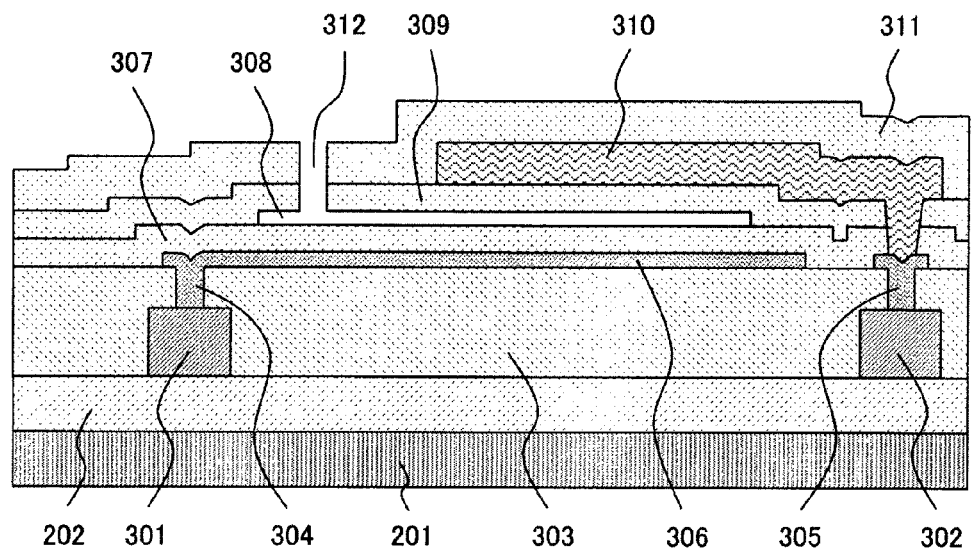
FIG. 13A is a cross-sectional view for showing a process of producing the ultrasonic transducer subsequent to FIG. 12A.
Figure 13B:
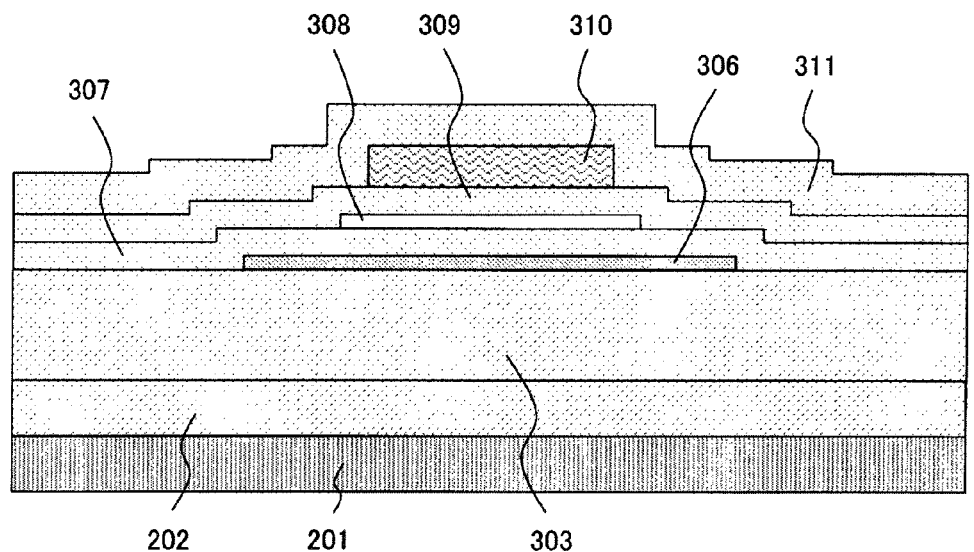
FIG. 13B is a cross-sectional view for showing a process of producing the ultrasonic transducer subsequent to FIG. 12B.

Then, the cavity 308 is formed by etching the sacrifice layer 1008 using xenon fluoride gas (XeF2) through the opening 312 (FIGS. 13A and 13B).

Figure 14A:
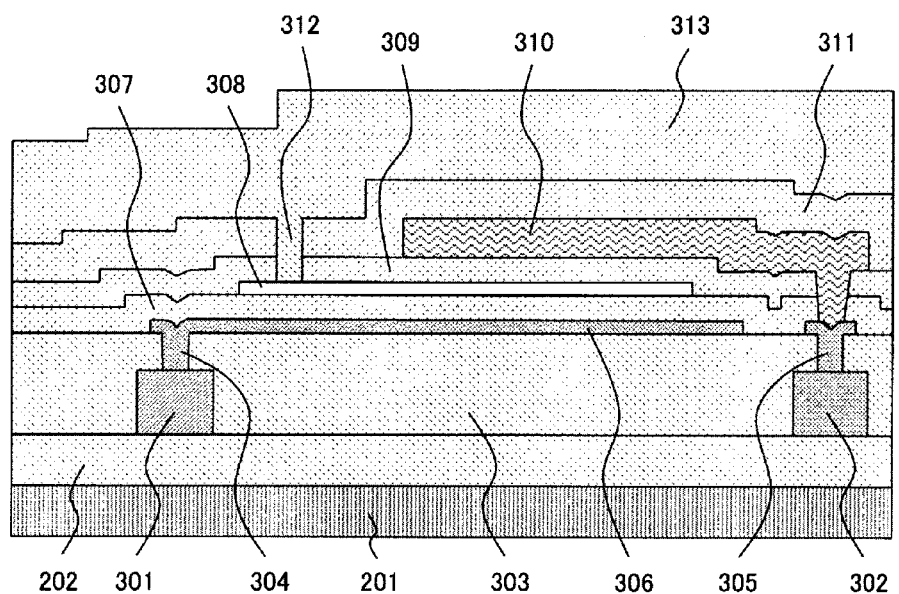
FIG. 14A is a cross-sectional view for showing a process of producing the ultrasonic transducer subsequent to FIG. 13A.
Figure 14B:
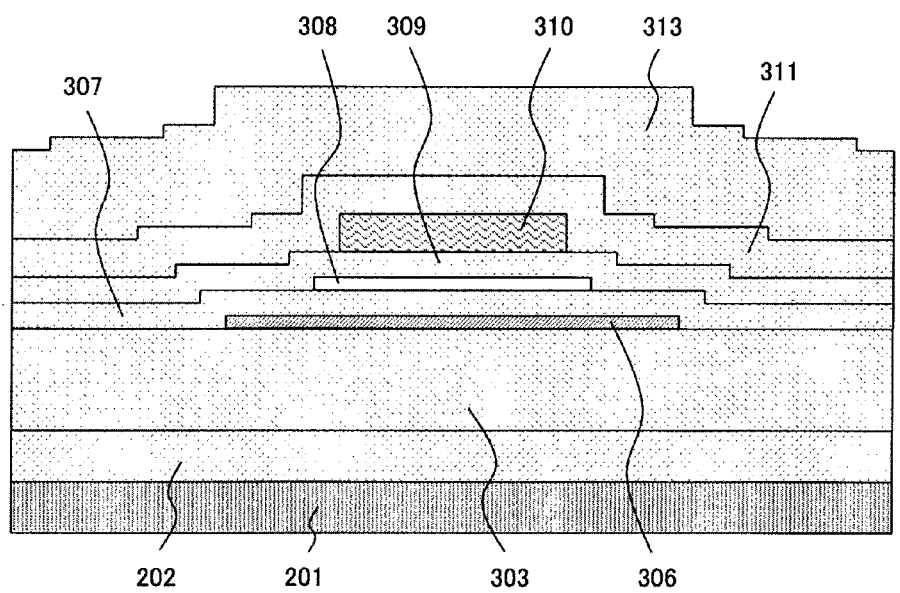
FIG. 14B is a cross-sectional view for showing a process of producing the ultrasonic transducer subsequent to FIG. 13B.

Next, about 800 nm of the silicon nitride insulating film 313 is deposited by the plasma CVD method to be embedded into the opening 312 (FIGS. 14A and 14B).

As described above, the CMUT in the first embodiment can be formed.

Figure 15A:
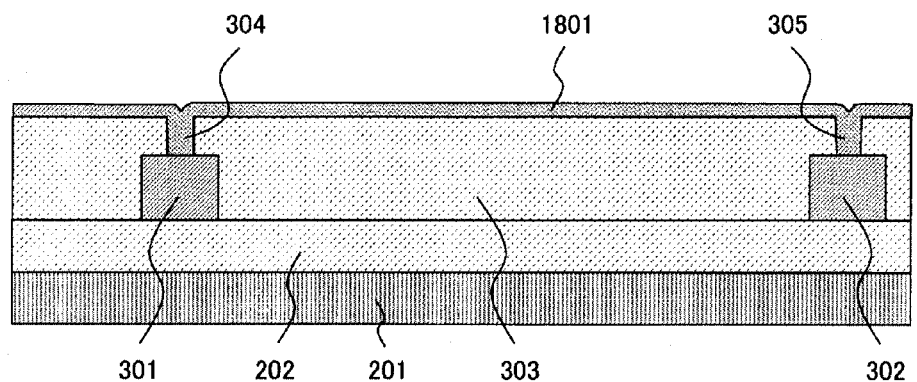
Figure 15B:
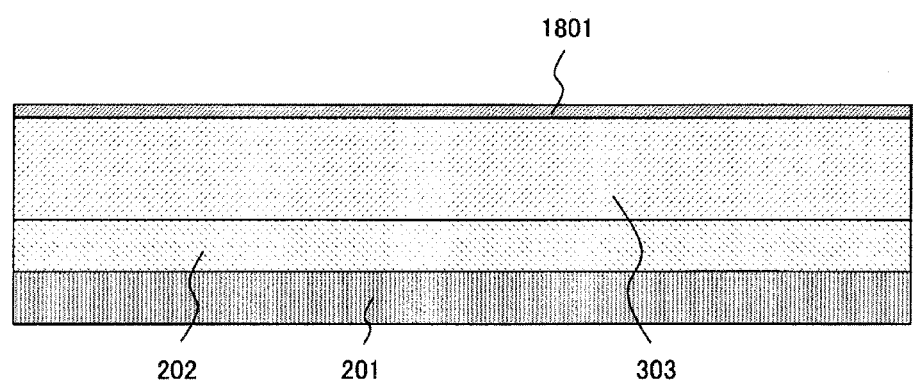
Figure 16A:
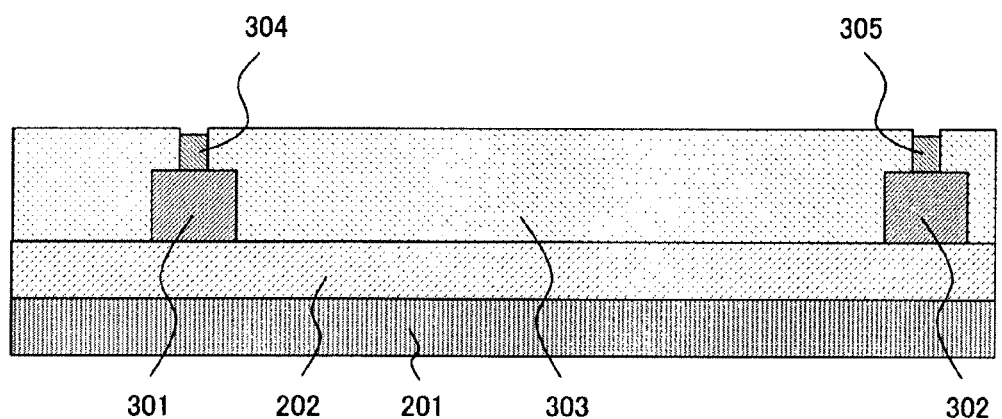
FIG. 16A is a cross-sectional view for showing a process of producing the ultrasonic transducer subsequent to FIG. 15A.
Figure 16B:
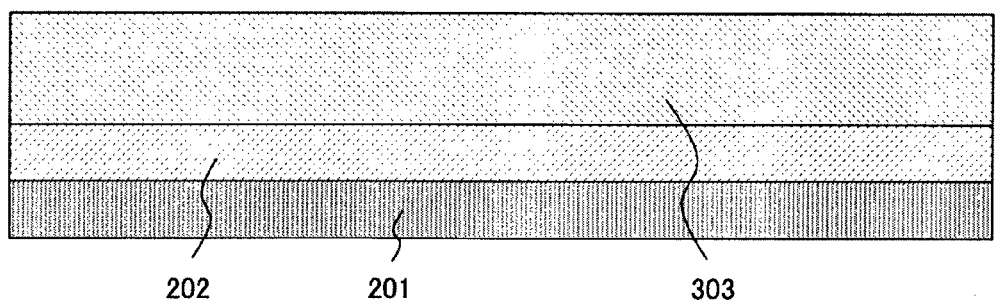
FIG. 16B is a cross-sectional view for showing a process of producing the ultrasonic transducer subsequent to FIG. 15B.
Figure 17A:
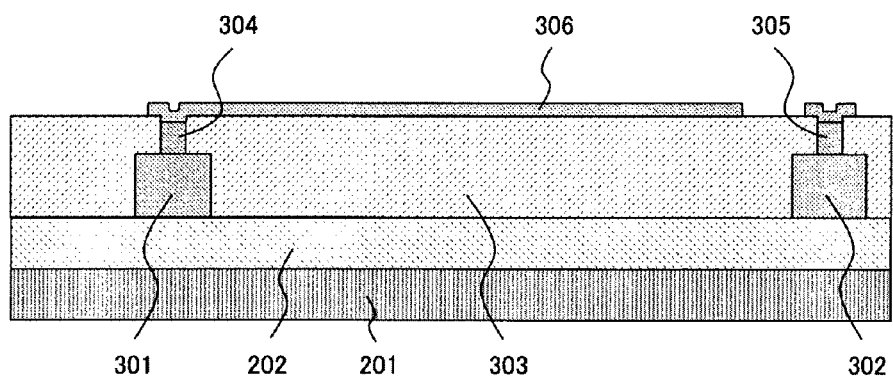
FIG. 17A is a cross-sectional view for showing a process of producing the ultrasonic transducer subsequent to FIG. 16A.
Figure 17B:
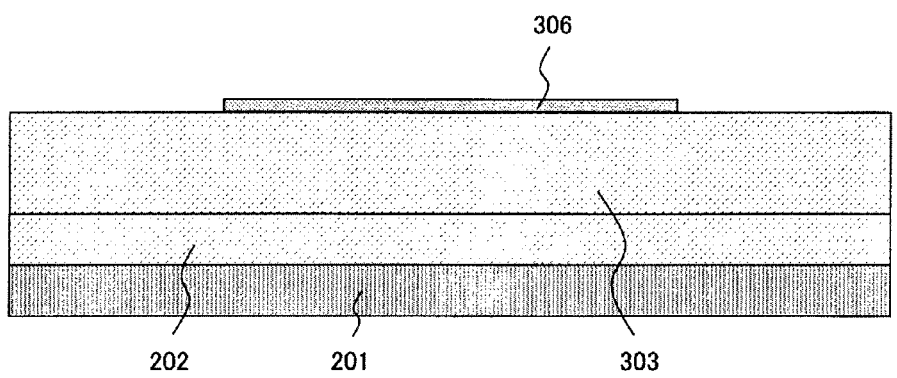
FIG. 17B is a cross-sectional view for showing a process of producing the ultrasonic transducer subsequent to FIG. 16B.

In the above-described producing method, when forming the bottom electrode, the opening 704 formed on the lower wiring is simultaneously embedded with the conductive film as a material of the bottom electrode to form the electric connection part 304 to the bottom electrode. However, the bottom electrode may be formed after the electric connection part to the bottom electrode is formed. The producing method in this case will be shown using FIGS. 15A and 15B to FIGS. 17A and 15B. A conductive film 1801 is deposited by the sputtering method after the state of FIGS. 4A and 4B. At this time, the conductive film 1801 with a thickness enough to be embedded into the openings 704 and 705 shown in FIG. 4A is deposited (FIGS. 15A and 15B). Thereafter, the conductive film 1801 deposited on the insulating film 303 is polished by the CMP method until an upper surface of the insulating film 303 is exposed. At this time, the electric connection part 304 to the bottom electrode and the electric connection part 305 to the top electrode remain in the insulating film 303. However, upper surfaces of the connection parts 304 and 305 are slightly dented relative to an upper surface of the insulating film 303 because of a recess caused by the CMP process (FIGS. 16A and 16B). Next, 100 nm of a conductive film serving as the bottom electrode is deposited by the sputtering method, and the bottom electrode 306 is formed by the lithography technique and the dry etching technique (FIGS. 17A and 17B). The following steps are the same as those subsequent to FIG. 6.

Figure 18A:
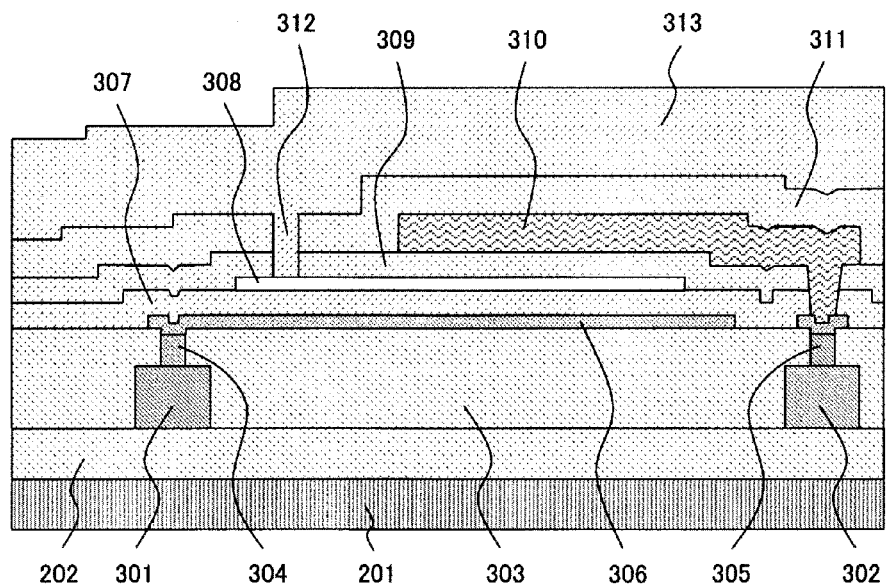
Figure 18B:
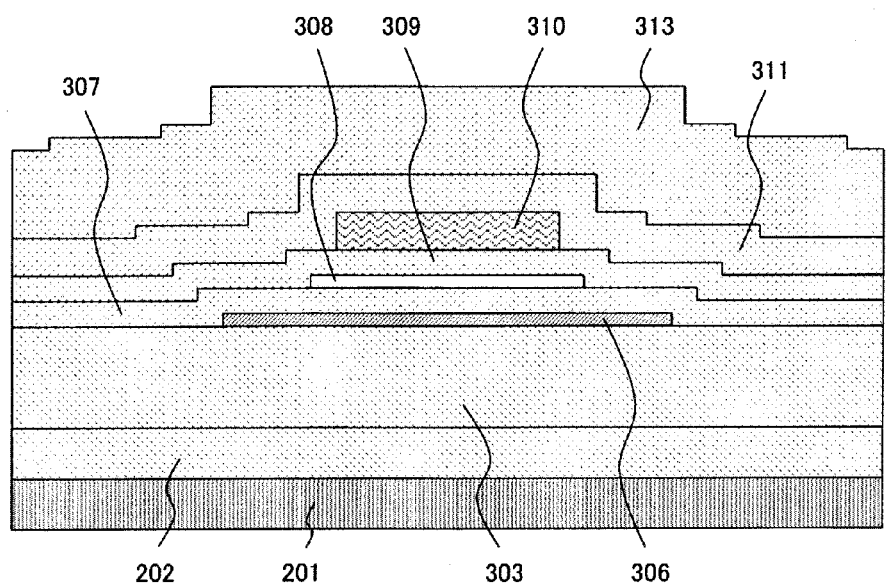
FIG. 18B is a cross-sectional view taken along the line B-B' of FIG. 1.

A cross-sectional view of the CMUT produced by this method is shown in FIG. 18.

In the producing method, the conductive film 1801 is first embedded into the openings 704 and 705 formed in the insulating film 303 shown in FIG. 4, and then the bottom electrode is formed. In the case where the diameters of the openings 704 and 705 are large, there is a possibility that the openings 704 and 705 cannot be embedded with 100 nm of the conductive film serving as the bottom electrode in the steps shown in FIG. 4 and FIG. 5. In this case, the conductive film deposited in the openings 704 and 705 is disconnected at bottom surfaces of the openings, causing failure of electric connection to the bottom electrode and the top electrode. Further, in the case where the conductive film having a thickness enough to be embedded into the openings 704 and 705 is deposited, the bottom electrode also becomes thick to generate a large bump of the bottom electrode, and dielectric strength voltage is decreased at a position where the top electrode overrides the bump of the bottom electrode.

On the other hand, in the steps shown in FIGS. 15A and 15B to FIGS. 17A and 17B, the conductive film 1801 having a thickness enough to be embedded into the openings 704 and 705 is deposited, and then an unnecessary part of the conductive film 1801 on the insulating film 303 is removed by the CMP method. Thus, the conductive film in the bottom electrode forming step can be made as thin as about 100 nm.

Figure 19:
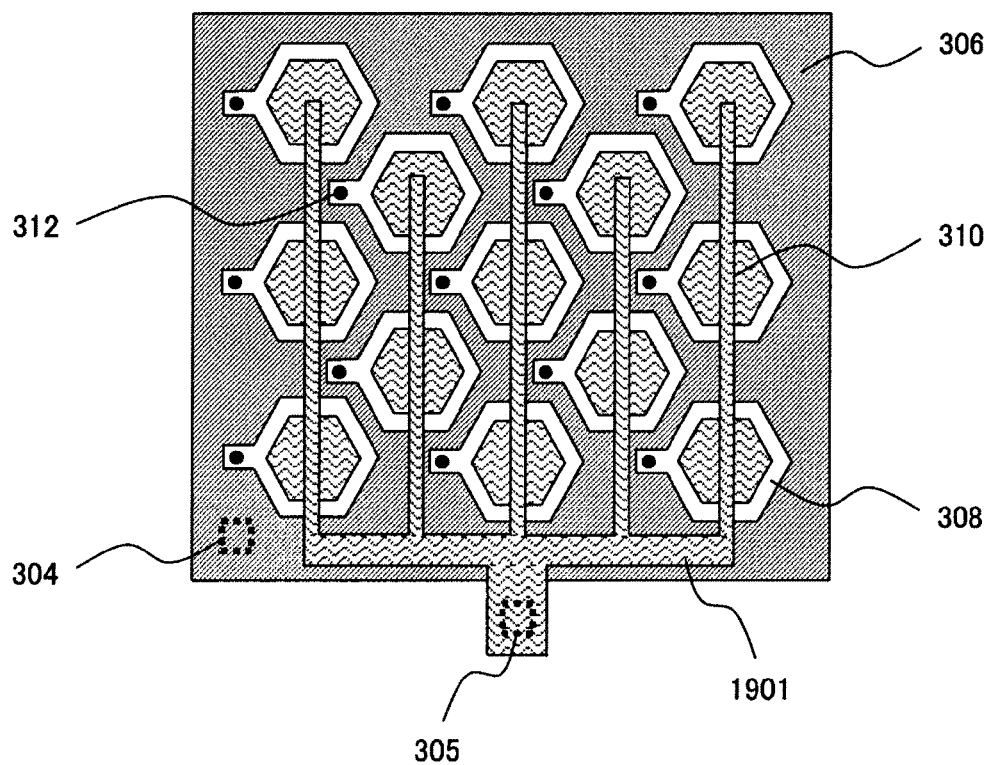
FIG. 19 is a top view for showing the ultrasonic transducer in which plural cavities overlaps one bottom electrode in the first embodiment of the present invention.

In the above description, the CMUT cell in which one cavity overlaps one bottom electrode is shown as in FIG. 1. However, plural cavities may overlap one bottom electrode as shown in FIG. 19. Specifically, thirteen cavities 308 overlap the bottom electrode 306 in the arrangement of FIG. 19. The respective top electrodes 310 overlap the thirteen cavities 308, and are bundled by a wiring 1901 to be connected to the electric connection part 305. In this mode, too, the electric connection part 304 to the bottom electrode 306 is positioned so as not to overlap the cavities 308 when seen from above, as similar to FIG. 1. Even in the case where each electrode is electrically connected from the lower surface thereof, the cavities 308 can be formed without affects of the shape at the electric connection part 304. Likewise, the membranes located above the cavities 308 are not affected. Thus, it is possible to suppress deformation in the cavities and non-uniformity in the thicknesses of the insulating films enclosing the cavities. In addition, it is possible to suppress deterioration in the flatness of the surface profiles of the membranes.

It should be noted that each cavity 308 of the CMUTs in FIG. 1 and FIG. 19 has a hexagonal shape seen from above. However, the shape is not limited to this, but may be an arbitrary shape.

The materials configuring the CMUT shown in the first embodiment are one of combinations, and other conductive materials may be used for the top electrode and the bottom electrode. Any material may be used for the sacrifice layer as long as etching selectivity with the insulating film enclosing the sacrifice layer can be secured. Thus, instead of the amorphous silicon film, an SOG film (Spin-on-Glass) or a metal film made of aluminum, tungsten, molybdenum, or chrome may be used. In the case of the SOG film among the above-described films, etching selectivity with the insulating film enclosing the sacrifice layer can be secured if hydrofluoric acid is used.

Second Embodiment

Figure 20:
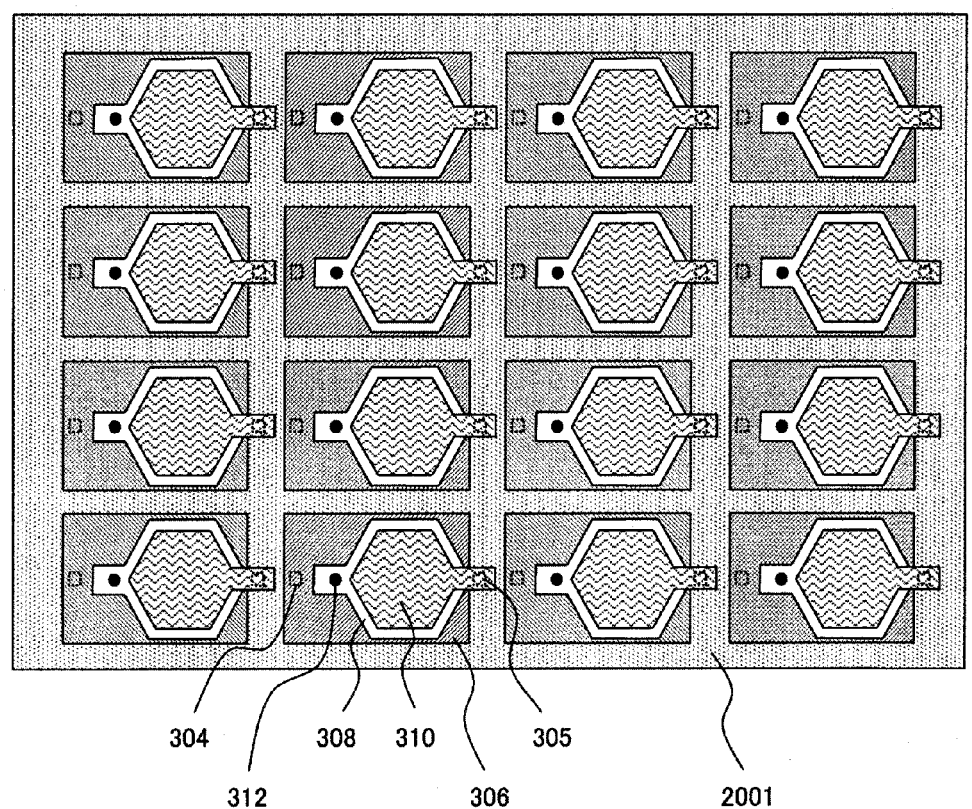
FIG. 20 is a top view for showing an ultrasonic transducer in a second embodiment of the present invention.

FIG. 20 is a top view of an ultrasonic transducer in which the CMUT cells shown in FIG. 1 are arranged in array. The reference numeral 306 denotes a bottom electrode; 308, a cavity; 310, a top electrode; and 312, an etching hole used for forming the cavity 308. Specifically, the etching hole 312 is connected to the cavity 308. The reference numeral 304 denotes a connection part that is electrically connected to the bottom electrode 306 from a lower surface of the bottom electrode, and 305 denotes a connection part that is electrically connected to the top electrode from a lower surface of the top electrode. The reference numeral 2001 denotes a semiconductor substrate on which the arrays are arranged. The cross-sectional structure of each CMUT cell configuring the arrays is the same as that shown in FIG. 2.

Figure 21:
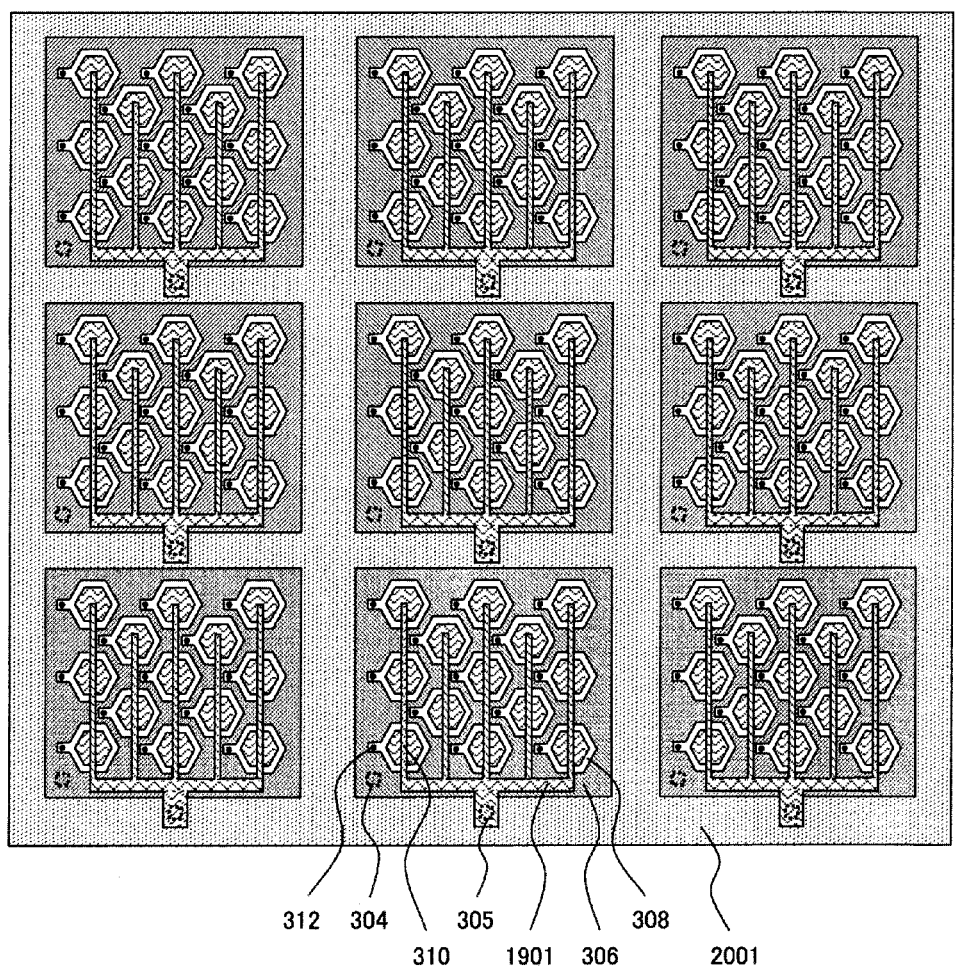
FIG. 21 is a top view for showing the ultrasonic transducer in which plural cavities overlaps one bottom electrode in the second embodiment of the present invention.
Figure 22:
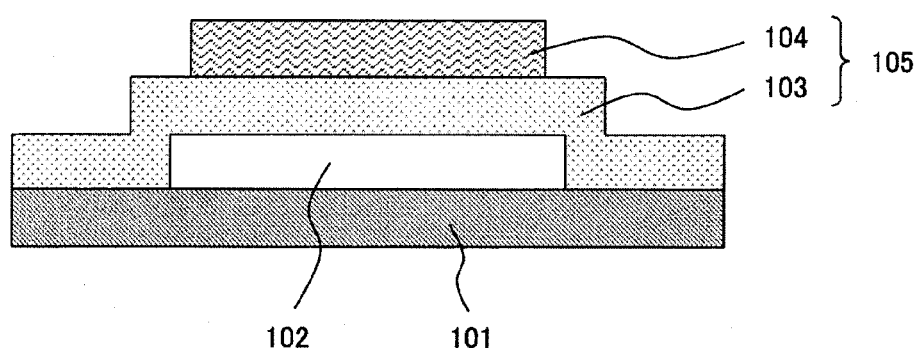
FIG. 22 is a cross-sectional view of an ultrasonic transducer studied by the inventors.
Figure 23A:
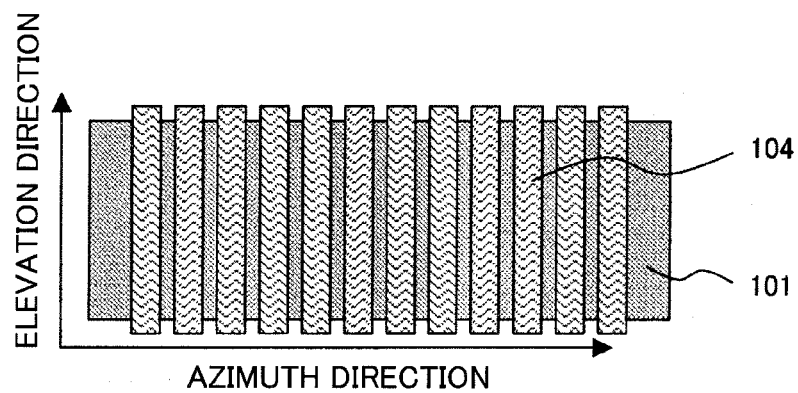
FIG. 23A is a top view showing the positions of electrodes in the case where the ultrasonic transducers studied by the inventors are arranged in array.
Figure 23B:
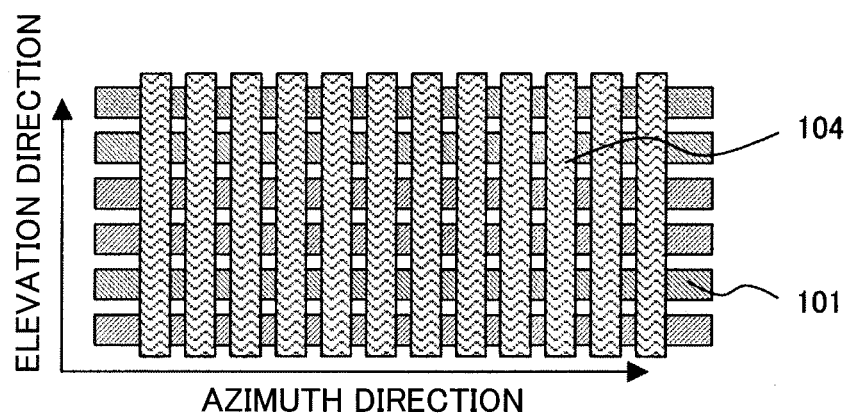
FIG. 23B is a top view showing the positions of electrodes in the case where the ultrasonic transducers studied by the inventors are arranged in array.
Figure 23C:
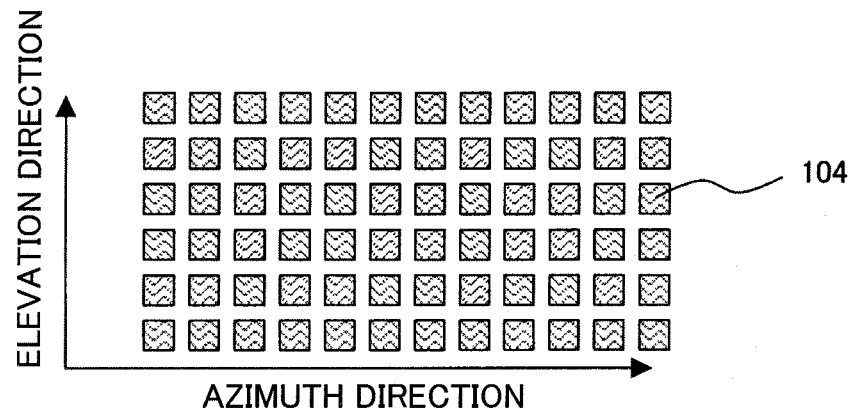
FIG. 23C is a top view showing the positions of electrodes in the case where the ultrasonic transducers studied by the inventors are arranged in array.
Figure 24:
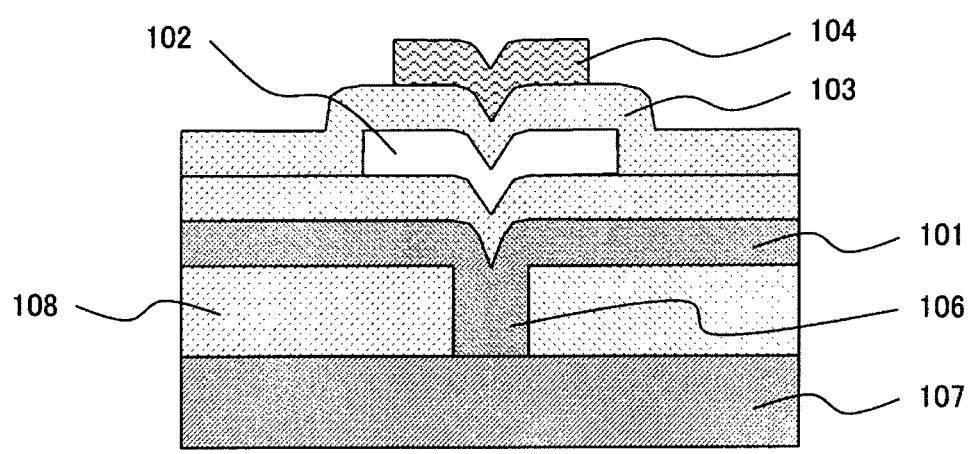
FIG. 24 is a cross-sectional view in the case where an electric connection part to a bottom electrode of the ultrasonic transducer studied by the inventors is positioned so as to overlap a cavity when seen from above.

FIG. 21 is a top view of an ultrasonic transducer in which the CMUT cells shown in FIG. 19 are arranged in array. The reference numeral 306 denotes a bottom electrode; 308, a cavity; 310, a top electrode; and 312, an etching hole used for forming the cavity 308. Specifically, the etching hole 312 is connected to the cavity 308. The reference numeral 304 denotes a connection part that is electrically connected to the bottom electrode 306 from the lower surface of the bottom electrode. The reference numeral 1901 denotes a wiring connecting the top electrodes 310 corresponding to the cavities configuring one CMUT cell, and 305 denotes a connection part that is electrically connected to the wiring 1901 from a lower surface of the wiring. The reference numeral 2001 denotes a semiconductor substrate on which the CMUT cells are arranged in array. The cross-sectional structure of each CMUT cell configuring the arrays is the same as that shown in FIG. 2.

In the second embodiment, the CMUT cells are arranged in array. The second embodiment is characterized in that the electric connection part 304 to the bottom electrode 306 of each CMUT cell is positioned so as not to overlap the cavity 308 when seen from above, as similar to the first embodiment. Even in the case where each electrode is electrically connected from the lower surface thereof, the cavity 308 can be formed without affects of the shape at the electric connection part 304 in such an arrangement. Likewise, the membrane located above the cavity 308 is not affected. Thus, it is possible to suppress deformation in the cavity and non uniformity in the thickness of the insulating film enclosing the cavity. In addition, it is possible to suppress deterioration in the flatness of the surface profile of the membrane.

INDUSTRIAL APPLICABILITY

The ultrasonic transducer according to the present invention can be widely used as a transducer for an ultrasonic diagnostic apparatus or an ultrasonic flaw detection apparatus.

REFERENCE SIGNS LIST

101 bottom electrode
102 cavity
103 insulating film
104 top electrode
105 membrane
106 electric connection part to bottom electrode
107 wiring arranged at lower layer of CMUT cell
108 insulating film
201 semiconductor substrate
202 insulating film
301 wiring arranged at lower layer of CMUT cell
302 wiring arranged at lower layer of CMUT cell
303 insulating film
304 electric connection part to bottom electrode
305 electric connection part to bottom electrode
306 bottom electrode
307 insulating film
308 cavity
309 insulating film
310 top electrode
311 insulating film
312 etching hole
313 insulating film
704 opening
705 opening
1008 sacrifice layer
1201 opening
1801 conductive film
1901 wiring
2001 semiconductor substrate

What is claimed is:

1. A method of producing an ultrasonic transducer, the method comprising:
   forming a wiring;
   forming a first insulating film that covers the wiring;
   flattening the first insulating film;

forming, in the first insulating film, a first opening that reaches the wiring;

forming an electric connection part by embedding a conductive film into the first opening;

forming a bottom electrode on the electric connection part;

forming a second insulating film that covers the bottom electrode;

forming a sacrifice layer on the first insulating film at a position where the sacrifice layer overlaps the bottom electrode, but does not overlap the electric connection part;

forming a third insulating film that covers the sacrifice layer;

forming a top electrode on the third insulating film that overlaps the sacrifice layer;

forming a fourth insulating film that covers the top electrode and the third insulating film;

forming a second opening that penetrates the third insulating film and the fourth insulating film to reach the sacrifice layer;

forming a cavity by removing the sacrifice layer using the second opening; and sealing the cavity by forming a fifth insulating film that covers the opening that reaches the second insulating film and the sacrifice layer.

2. The method of producing the ultrasonic transducer of claim 1, wherein the forming the electric connection part by embedding the conductive film into the first opening and the forming the bottom electrode on the electric connection part, are performed in one step.

3. The method of producing the ultrasonic transducer of claim 1, wherein the forming the wiring comprises forming the wiring on a semiconductor substrate.

* * * * *